(12) United States Patent
Berger et al.

(10) Patent No.: US 7,297,990 B1
(45) Date of Patent: Nov. 20, 2007

(54) SI/SIGE INTERBAND TUNNELING DIODE STRUCTURES INCLUDING SIGE DIFFUSION BARRIERS

(75) Inventors: Paul R. Berger, Columbus, OH (US); Phillip E. Thompson, Springfield, VA (US); Niu Jin, Columbus, OH (US)

(73) Assignee: The Ohio State University, Columbus, OH (US)

( * ) Notice: Subject to any disclaimer, the term of this patent is extended or adjusted under 35 U.S.C. 154(b) by 256 days.

(21) Appl. No.: 10/903,442

(22) Filed: Jul. 30, 2004

Related U.S. Application Data

(60) Continuation-in-part of application No. 09/934,334, filed on Aug. 21, 2001, which is a division of application No. 09/565,455, filed on May 5, 2000, now Pat. No. 6,803,598.

(60) Provisional application No. 60/492,039, filed on Aug. 1, 2003, provisional application No. 60/133,067, filed on May 7, 1999.

(51) Int. Cl.
*H01L 29/00* (2006.01)
(52) U.S. Cl. .......................... 257/106; 257/104
(58) Field of Classification Search ................ 257/104, 257/106, 19, 25
See application file for complete search history.

(56) References Cited

U.S. PATENT DOCUMENTS 6,271,551 B1 * 8/2001 Schmitz et al. ............. 257/288

6,803,598 B1   10/2004 Berger et al.
2003/0049894 A1   3/2003 Berger et al.

OTHER PUBLICATIONS

Jin et al., "Diffusioin Barrier Cladding in Si/SiGe Resonant Interband Tunneling . . . ", IEEE Transactions on Electron Devices, vol. 50, No. 9, pp. 1876-1884, Sep. 2003.
Weaver et al., "Radiation Tolerance of $Si/Si_{0.6}Fe_{0.4}$ Resonant Interband Tunneling Diodes," 2004 American Institute of Physics, vol. 95, No. 11, pp. 6406-6408, Jun. 2004.
Jin et al., "151 $kA/cm^2$ Peak current Densities in . . . ", Applied Physics Letters, vol. 83, No. 16, pp. 3308-3310, Oct. 2003.
Hobart et al., "'*p-on-n*'" Si Interband Tunnel Diode Grown by Molecular Beam Epitaxy, 2001 American Vacuum Society, J. Vac. Sci. Technolo. B, vol. 19, No. 1, pp. 290-293, Jan./Feb. 2001.
Jin et al., "*pnp* Si Resonant Interband Tunnel Diode . . . ," Electronics Letters, vol. 37, No. 23, pp. 1412-1414, Nov. 2001.

(Continued)

*Primary Examiner*—Sara Crane
(74) *Attorney, Agent, or Firm*—Fay Sharpe LLP

(57) ABSTRACT

A silicon-based interband tunneling diode (10, 110) includes a degenerate p-type doping (22, 130) of acceptors, a degenerate n-type doping (32, 118) of donors disposed on a first side of the degenerate p-type doping (22, 130), and a barrier silicon-germanium layer (20, 136) disposed on a second side of the degenerate p-type doping (22, 130) opposite the first side. The barrier silicon-germanium layer (20, 136) suppresses diffusion of acceptors away from a p/n junction defined by the degenerate p-type and n-type dopings (22, 32, 118, 130).

21 Claims, 7 Drawing Sheets

OTHER PUBLICATIONS

Dashiell et al., "Current-Voltage Characteristics of High Current Density Silicon . . . ", IEEE Transactions on Electron Devices, vol. 47, No. 9, pp. 1707-1714, Sep. 2000.

Thompson et al., "Epitaxial Si-Based Tunnel Diodes," Elsevier, Thin Solid Films 380, pp. 145-150, (2000).

Thompson et al., "Si Resonant Interband Tunnel Diodes Grown by . . . ," Applied Physics Letters, vol. 75, No. 9, pp. 1308-1310, Aug. 1999.

Rommel et al., "Epitaxially Grown Si Resonant Interband Tunnel . . . ," IEEE Electron device Letters, vol. 20, No. 7, pp. 329-331, Jul. 1999.

Rommel et al., "Room Temperature Operation of Epitaxially Grown . . . ," Applied Physics Letters, vol. 73, No. 15, pp. 2191-2193, Oct. 1998.

Khorenko et al., "Influence of layer structure on the current-voltage . . . ," Journal of Applied Physics, vol. 96, No. 7, pp. 3848-3851, (2004).

Auer et al., "Low-Voltage MOBILE Logic Module Based on . . . ," IEEE Electron Device Letters, vol. 22, No. 5, pp. 215-217, (2001).

Duschl et al., "Room temperature I-V characteristics of . . . ," Physica E 7, pp. 836-839, (2000).

Eberl et al., "Self-assembling SiGe and SiGeC nanostructures for . . . ," Thin Solid Films 369, pp. 33-38, (2000).

Duschl et al., "Epitaxially grown Si/SiGe interband tunneling diodes . . . ," Applied Physics Letters, vol. 76, No. 7, pp. 879-881, (2000).

Duschl et al., "High room temperature peak-to-valley current ratio . . . ," Electronics Letters, vol. 35, No. 13, pp. 2, (1999).

Duschl et al., "Physics and applications of Si SiGe Si resonant . . . ," Thin Solid Films 380, pp. 151-153, (2000).

* cited by examiner

SI/SIGE INTERBAND TUNNELING DIODE STRUCTURES INCLUDING SIGE DIFFUSION BARRIERS

This application claims the benefit of U.S. Provisional Application Ser. No. 60/492,039 filed on Aug. 1, 2003. This application is a continuation-in-part application of U.S. application Ser. No. 09/934,334 filed Aug. 21, 2001, which is a divisional application of U.S. application Ser. No. 09/565,455 filed May 5, 2000 which issued as U.S. Pat. No. 6,803,598 on Oct. 12, 2004, which claims the benefit of U.S. Provisional Application Ser. No. 60/133,067 filed May 7, 1999.

U.S. Provisional Application Ser. No. 60/492,039 is incorporated by reference herein in its entirety. U.S. patent application Ser. No. 09/934,334, filed on Aug. 21, 2001 and published as US 2003-0049894 A1 on Mar. 13, 2003, is incorporated by reference herein in its entirety.

This invention was made with Government support under grant no. ECS-0196208 awarded by the National Science Foundation and under grant no. ECS-196054 awarded by the National Science Foundation. The Government has certain rights in this invention.

BACKGROUND

The following relates to the semiconductor arts. It especially relates to Si/SiGe interband tunneling diode (ITD) structures such as Esaki-like Si/SiGe ITD's, Si/SiGe resonant interband tunneling diodes (i.e., RITD's), and the like, and will be described with particular reference thereto. However, the following will also find application in conjunction with Esaki-like interband tunneling diode device structures in other material systems, and in electronic and optoelectronic devices incorporating same.

Tunnel diodes have numerous potential and actual applications, including but not limited to local oscillators, frequency locking circuits, advanced SRAM circuits, highly integrated analog/digital converters, high speed digital latches, and so forth. Tunneling is a very fast phenomenon; hence ITD-based devices typically are operable at high frequencies.

Interband tunneling diode structures include degenerately doped n-type and p-type regions, sometimes very thin, in sufficiently close relative proximity so that electrons and holes can cross the p/n junction by quantum mechanical tunneling. In some ITD structures, the degenerate doping required is achieved using delta doping to concentrate the doping density to approximately the solid solubility limit. If the delta doping is very thin and of high enough doping density, it can also lead to quantum well regions that confine carriers. With a quantum well on the p-side and n-side of the p/n junction diode, resonant interband tunneling (e.g. RITD) can occur when the quantum wells are spaced closed enough for an overlap of the carrier wavefunctions. The ITD structure is challenging to produce, because dopant segregation and dopant diffusion during growth lowers the doping density and degrades the negative differential resistance (NDR). Using low temperature epitaxy reduces dopant movement during growth which increases the tunneling that manifests in an elevated peak current and a larger peak-to-valley current ratio (PVCR).

However, low temperature epitaxy also typically introduces higher point defect concentrations which increase the valley current of the negative differential resistance region. Point defect concentrations can be reduced by post-growth annealing; however, the annealing can induce solid state dopant diffusion that degrades the peak current of the negative differential resistance region. In some silicon-based ITD structures, a silicon-germanium layer is interposed between the degenerately p-doped and degenerately n-doped regions to reduce diffusion of dopants across the p/n junction during the post-growth anneal. The interposed silicon-germanium layer provides improved thermal stability of the doping profile during post-growth annealing; however, the thermal budget is still found to be limited by dopant diffusion.

The present invention contemplates improved apparatuses and methods that overcomes the above-mentioned limitations and others.

BRIEF SUMMARY

According to one aspect, a silicon-based interband tunneling diode includes a degenerate p-type doping of acceptors, a degenerate n-type doping of donors disposed on a first side of the degenerate p-type doping, and a barrier silicon-germanium layer disposed on a second side of the degenerate p-type doping opposite the first side. The barrier silicon-germanium layer suppresses diffusion of acceptors away from a p/n junction defined by the degenerate p-type and n-type dopings.

According to another aspect, an interband tunneling diode is disclosed, including one or more semiconductor layers selected from a group consisting of (i) a silicon layer and (ii) a silicon-germanium layer. A degenerate p-type doping of acceptors is substantially disposed within a containing silicon-germanium layer of the one or more semiconductor layers. A degenerate n-type doping of donors is substantially disposed within or between one or more of the semiconductor layers other than the containing silicon-germanium layer.

According to yet another aspect, a semiconductor device is disclosed. The device is made by a process comprising forming one of: (i) a barrier silicon-germanium layer, a degenerate p-type doping, and a degenerate n-type doping, in that order, and (ii) a degenerate n-type doping, a degenerate p-type doping, and a barrier silicon-germanium layer, in that order.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings, layer thicknesses and other dimensions are not drawn to scale.

DETAILED DESCRIPTION OF PREFERRED EMBODIMENTS

Figure 1:
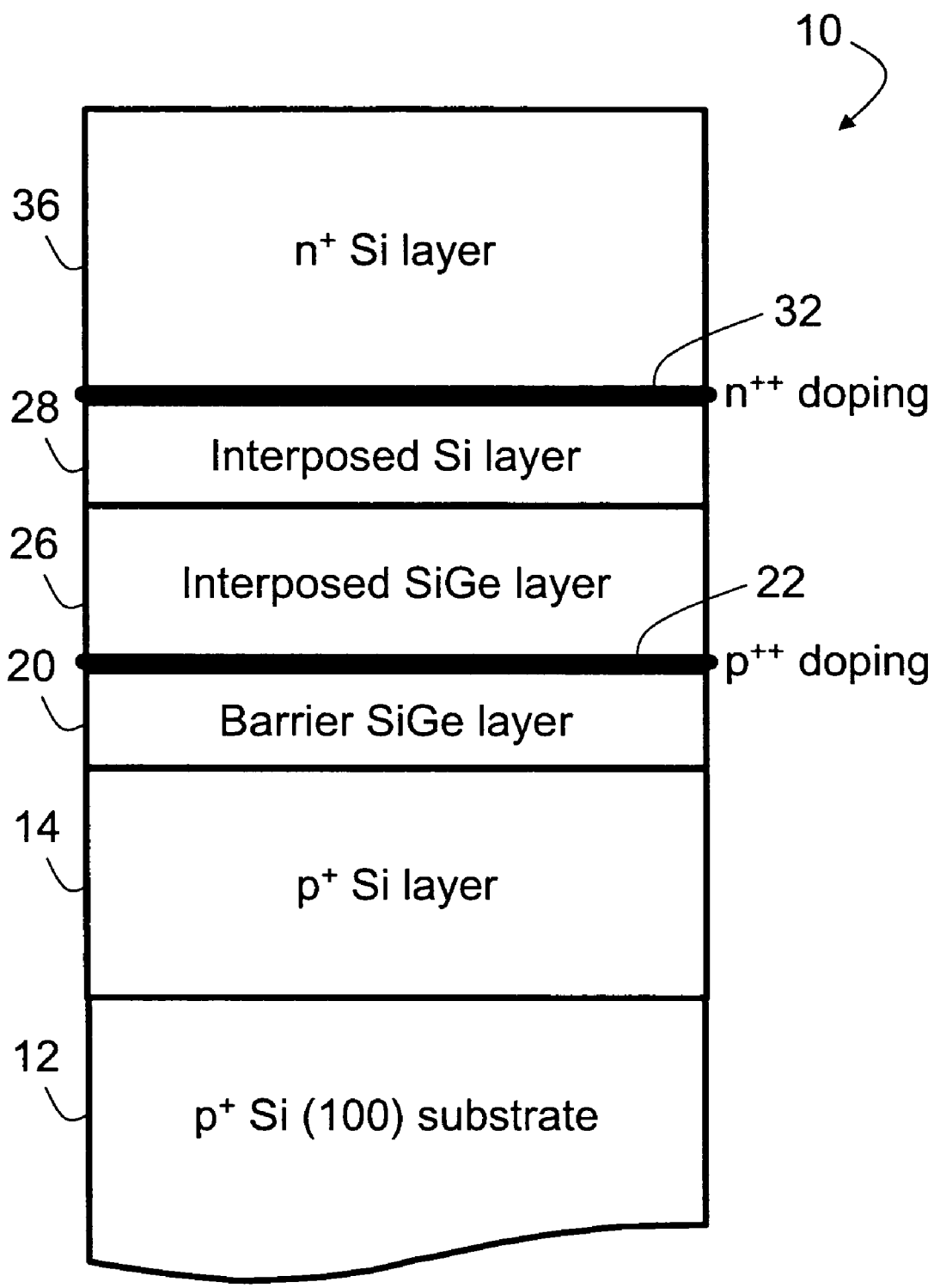
FIG. 1 diagrammatically shows the layer structure of an interband tunneling diode structure having an n-on-p orientation.

With reference to FIG. 1, an example interband tunneling diode (ITD) 10 is formed on a $p^+$ silicon substrate 12. The ITD 10 includes a plurality of group IV layers epitaxially grown on the substrate 12 by a suitable low temperature epitaxy method that reduces dopant segregation and diffusion during epitaxial growth, such as low temperature molecular beam epitaxy (LT-MBE), low pressure chemical vapor deposition (LPCVD), ultra-high vacuum chemical vapor deposition (UHV-CVD), solid phase epitaxy, or the like. In the illustrated example embodiment, the ITD 10 includes an epitaxial $p^+$ silicon layer 14 grown on the substrate 12 and a barrier silicon-germanium layer 20 grown on the $p^+$ silicon layer 14, followed by formation of a degenerately p-type doped region 22. In FIG. 1, the degenerately doped p-type region 22 is a p-type delta doping formed as follows: during a growth interruption in which the group IV epitaxial growth is interrupted, an acceptor species is applied to the exposed surface of the barrier silicon-germanium layer 20 to produce a high concentration of p-type dopant in a thin region. In other embodiments, the degenerately doped p-type region 22 is generated by supplying a high concentration of acceptors during a selected time interval of continuous group IV crystal growth.

After the p-type degenerate doping 22 is formed, the group IV epitaxial growth continues with formation of one or more interposed layers 26, 28 followed by formation of a degenerately n-type doped region 32. In FIG. 1, the degenerately doped n-type region 32 is an n-type delta doping formed during another growth interruption. In other embodiments, the degenerately doped n-type region 32 is generated by supplying a high concentration of donors during a selected time interval of continuous group IV crystal growth. The interposed layers 26, 28 are interposed between the p-type and n-type degenerate dopings 22, 32. In the illustrated embodiment, the interposed layers 26, 28 include interposed silicon-germanium layer 26 formed on the cladding silicon-germanium layer 20 and the p-type degenerate doping 22, followed by interposed silicon layer 28 formed on the interposed silicon-germanium layer 26. An epitaxial $n^+$ silicon layer 36 is formed on the interposed silicon layer 28 and the n-type degenerate doping 32.

The degenerate dopings 22, 32 can be delta-doped regions, or can be formed during a time interval of reduced or slow growth rate, or can be formed without interrupting or slowing the group IV crystal growth, as long as the rate of dopant introduction during formation of the degenerate doping is high enough to produce the desired high concentration of dopant. In some embodiments one of the degenerate dopings 22, 32 is a delta doping while the other is formed during continuous group IV crystal growth. Moreover, even when the degenerate dopings 22, 32 are formed during a complete growth stop, those skilled in the art recognize that the resulting dopant profiles are not planar; rather, due to dopant segregation, dopant diffusion, or the like during epitaxial growth the acceptors and donors each have some finite distribution along the epitaxial growth direction, which may be Gaussian or otherwise shaped. Using a low temperature epitaxial growth technique generally reduces the width or extent of this finite distribution. The finite distribution is also expected to increase in width or extent in response to thermal processing, such as rapid thermal annealing processing which are described herein. When the p-type degenerately doped region 22 is thin enough, such as in the case of a narrow-distribution p-type delta doping, a degenerate two-dimensional hole gas is formed. Similarly, when the n-type degenerately doped region 32 is thin enough, such as in the case of a narrow-distribution n-type delta doping, a degenerate two-dimensional electron gas is formed.

In some embodiments, the barrier silicon-germanium layer 20 and the interposed silicon-germanium layer 26 have the same germanium fraction. In these embodiments, it will be recognized that the barrier silicon-germanium layer 20 and the interposed silicon-germanium layer 26 define a single silicon-germanium layer of common germanium fraction, and the p-type degenerate doping 22 is substantially disposed within that silicon-germanium layer. In other embodiments, the barrier and interposed silicon-germanium layers 20, 26 have different germanium fractions and thus are identifiable as distinct group silicon-germanium layers. In some embodiments one or both silicon-germanium layers 20, 26 may incorporate compositional grading of the germanium fraction. While the barrier silicon-germanium layer 20 has a thickness of about 1 nanometer for the specific examples described herein, a barrier thickness of substantially greater than 1 nanometer can be used, which is expected to provide improved suppression of acceptor out-diffusion from the p/n junction. Substantially the only restriction on germanium concentration and overall thickness is the critical thickness, well known to those skilled in the art. Above the critical thickness, lattice mismatch between Si and Ge leads to misfit dislocations when it becomes energetically favorable to relieve the strain energy by dislocation formation over plastic deformation of the lattice. Due to the low growth temperatures, in some embodiments a metastable silicon-germanium layer may be grown above the thermodynamic critical thickness without introducing deleterious dislocation densities.

A p/n junction exists between the p-type and n-type degenerate dopings 22, 32. The barrier silicon-germanium layer 20 is disposed on the p-type side of the p-type degenerate doping 22. The interposed silicon-germanium layer 26 on the n-type side of the p-type degenerate doping 22 is believed to suppress dopant diffusion across the p/n junction. The interposed silicon layer 28 has a lower band-gap than the interposed silicon-germanium layer 26, thus promoting interband tunneling. The additional germanium provides for greater momentum mixing within the tunneling spacer with its unique band structure and gamma valley minimum near the L-valley minimum. The enhanced tunneling within Ge-containing layers versus pure Si allows for higher current densities that often leads to enhanced PVCRS. However, in some contemplated embodiments all the group IV layers interposed between the p-type and n-type degenerate dopings 22, 32 contain germanium. For example, a single silicon-germanium layer can be interposed between the p-type and n-type degenerate dopings 22, 32, or a plurality of silicon-germanium layers having different germanium fractions can be interposed between the p-type and n-type degenerate dopings 22, 32.

In one example, the ITD structure of FIG. 1 was grown by LT-MBE using an elemental silicon electron beam source, the p+ substrate 12 was a 76 mm diameter boron-doped silicon wafer having a (100) crystallographic orientation with a resistivity of between about 0.015 ohm-cm and about 0.04 ohm-cm. The epitaxial p+ silicon layer 14 was grown to a thickness of about 80 nanometers with a nominal p-type doping of $5\times10^{19}$ cm$^{-3}$, and the barrier silicon-germanium layer 20 was grown with a germanium fraction of about 0.4 to a thickness of about 1 nanometer, without intentional doping. The acceptor species used for the p-type degenerate doping 22 was boron, applied as a delta doping with a nominal planar doping level of $1\times10^{14}$ cm$^{-2}$. Instead of boron, another p-type dopant such as aluminum or gallium can be used. The interposed silicon-germanium layer 26 was grown with the same germanium fraction as the cladding silicon-germanium layer 20, that is, with a germanium fraction of about 0.4, to a thickness of about 4 nanometers, without intentional doping. The interposed silicon layer 28 was grown to a thickness of about 2 nanometers, without intentional doping. The donor species used for the n-type degenerate doping 32 was phosphorus, applied as a delta doping with a nominal planar doping level of $1\times10^{14}$ cm$^{-2}$. Instead of phosphorus, another n-type dopant such as lithium, antimony, arsenic, or bismuth can be used. The epitaxial n+ silicon layer was grown to a thickness of about 100 nanometers with a nominal n-type doping of $5\times10^{19}$ cm$^{-3}$. The ITD structure grown with these parameters is referred to herein as "ITD with barrier".

To demonstrate the beneficial effect of the barrier silicon-germanium layer 20, two different reference ITD structures were grown without a barrier silicon-germanium layer. A structure designated "ITD ref2" was grown nominally identical to "ITD with barrier" structure except that the barrier silicon-germanium layer 20 was omitted. A structure designated "ITD ref1" was grown nominally identical to "ITD with barrier" structure except that: (i) the barrier silicon-germanium layer 20 was omitted; and (ii) the interposed layers of the "ITD with barrier" structure were replaced by the following symmetric sequence of not intentionally doped interposed layers: 1 nanometer silicon/4 nanometers silicon-germanium/1 nanometer silicon, with a germanium fraction of 0.4 for the central interposed 4 nanometer silicon-germanium layer. It will be noted that all three structures: "ITD with barrier", "ITD ref1", and "ITD ref2", have the same nominal tunnel barrier thickness of 6 nanometers between the degenerate dopings 22, 32. The structure "ITD with barrier" was compared with "ITD ref1" and "ITD ref2" to demonstrate the advantages of the barrier silicon-germanium layer 20.

Silicon-based ITD structures grown by LT-MBE typically exhibit relatively high valley currents in the negative differential resistance region. Post-growth annealing typically reduces the valley current. The elevated valley current in the as-grown ITD structures is due to high concentrations of point defects produced by the low temperature epitaxy. The concentration of these defects is reduced, or their electrical activity is reduced, by the post-growth annealing. Accordingly, the ITD structures were processed by rapid thermal annealing (RTA) for one minute at selected temperatures. Although the RTA processing reduces the valley current, excessive annealing produces solid state diffusion of the dopants, which broadens the degenerate dopings 22, 32 and reduces the peak current of the negative differential resistance region. The "ITD with barrier" structure withstands higher annealing temperature versus the "ITD ref1" and "ITD ref2" structures. The barrier silicon-germanium layer 20 reduces outdiffusion of the acceptors of the p-type degenerate doping 22 away from the p/n junction, thus allowing higher annealing temperature. Boron acceptors are fast interstitial diffusers in silicon; hence, control of diffusion of acceptors away from the p/n junction by the barrier silicon-germanium layer 20 facilitates higher thermal annealing budgets.

To perform comparative electrical measurements of the "ITD with barrier", "ITD ref1", and "ITD ref2" structures, RTA processing was performed for one minute in a forming gas ambient using an RTP-600S furnace (available from Modular Process Technology Corporation, San Jose, Calif.). After the RTA processing, Ti/Au metallization dots with various diameters were patterned on the surface of the ITD using contact lithography. A buffered oxide etch was used prior to the metallization. Using the Ti/Au dots as self-aligned masks, HF/HNO$_3$ wet etching was performed to define diode mesas. Finally, a Ti/Au backside contact was thermally evaporated on the backside of the ITD.

Figure 2:
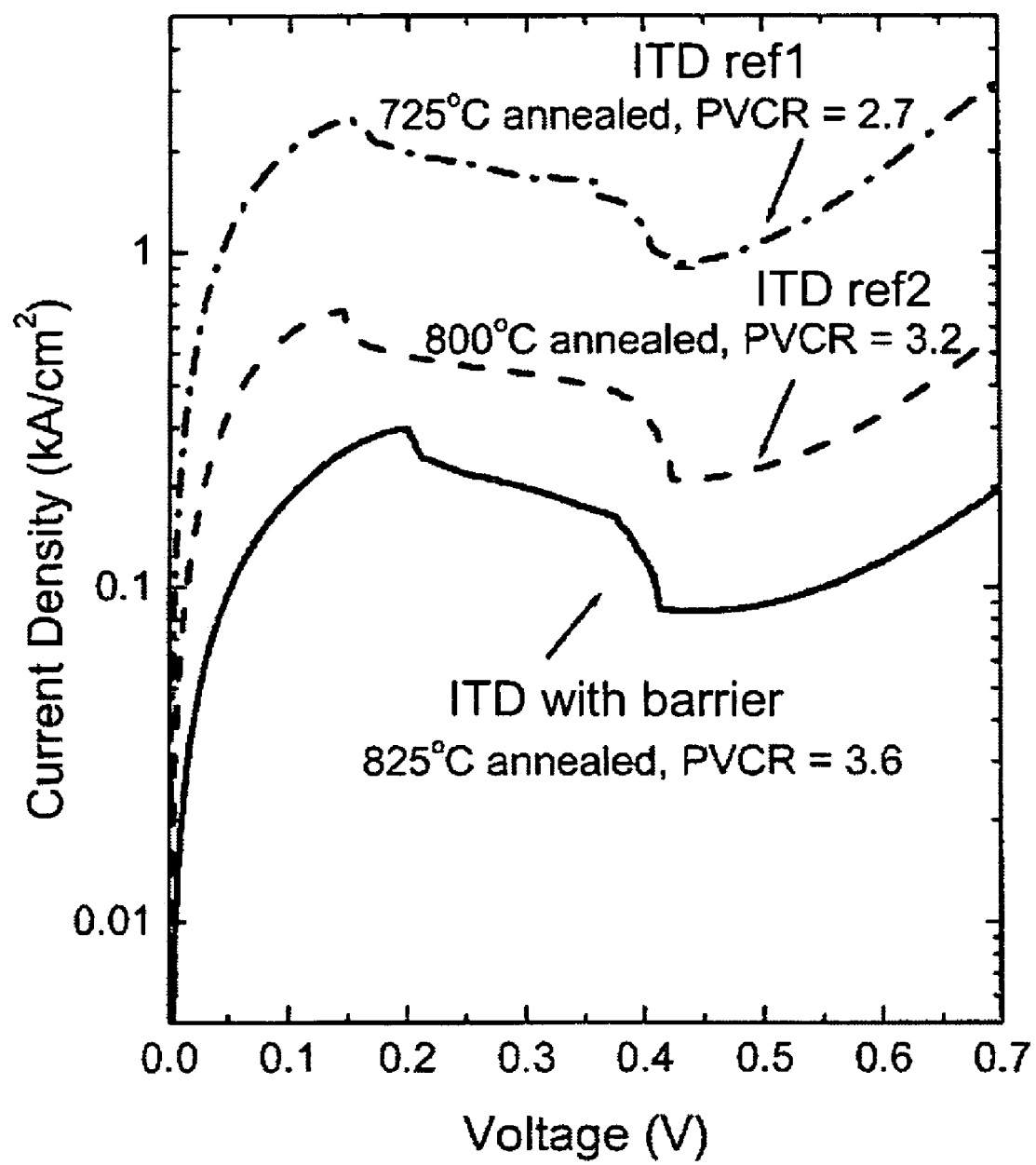
FIG. 2 shows log(current)-voltage characteristics for three different interband tunneling diode structures, one of which has the layer structure of FIG. 1 including the barrier silicon-germanium layer. The RTA temperature for each structure in FIG. 2 was optimized for that structure.
Figure 3:
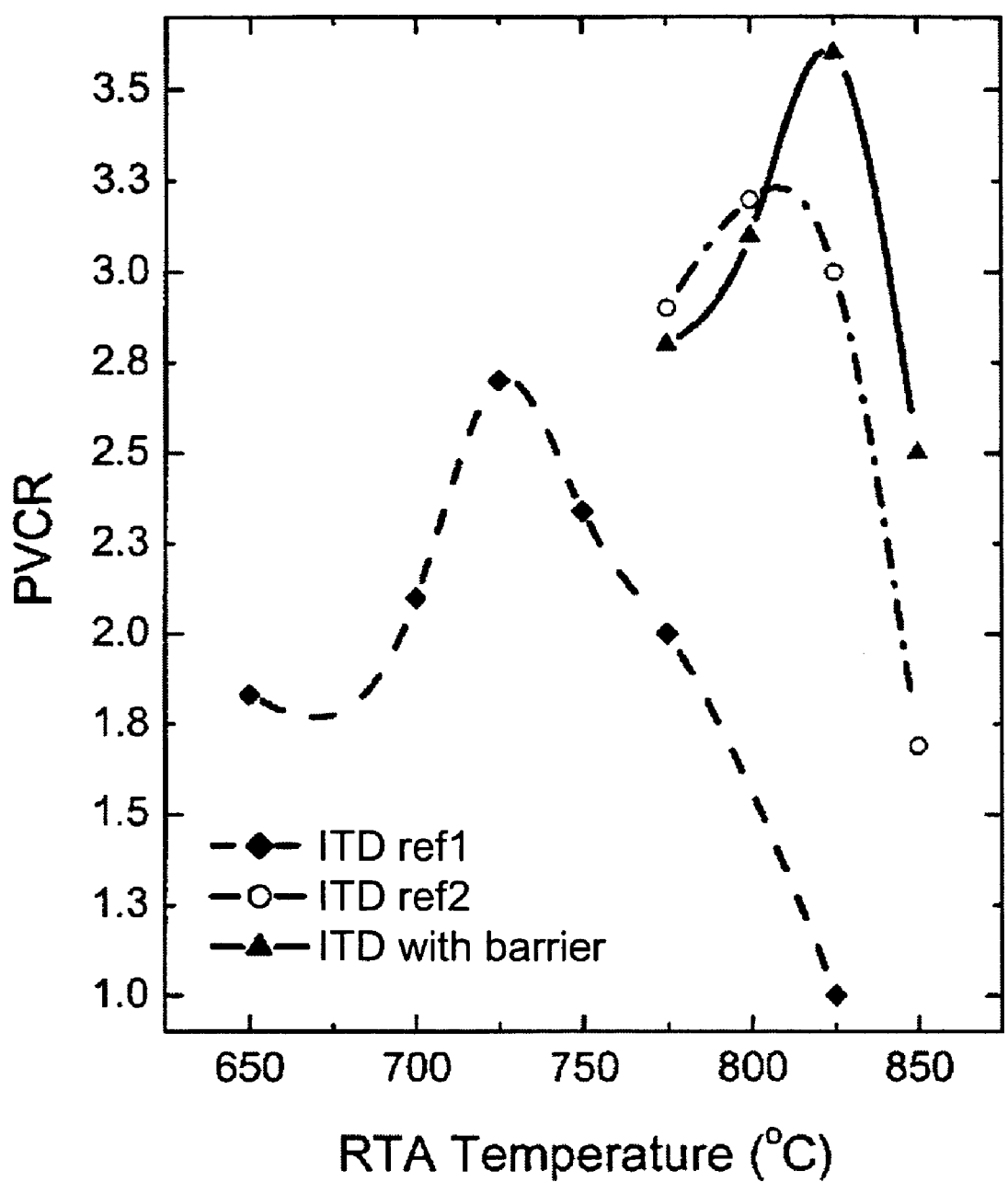
FIG. 3 plots peak-to-valley current ratio (PVCR) versus rapid thermal annealing (RTA) temperature for one minute anneals of the three different interband tunneling diode structures. The optimal RTA temperature for each structure corresponds to the peak of the PVCR for that structure.

With reference to FIGS. 2 and 3, FIG. 2 shows log (current)-voltage characteristics for each of the "ITD with barrier", "ITD ref1", and "ITD ref2" structures, using an anneal temperature for each structure that produced a highest peak-to-valley current ratio (PVCR) for the negative differential resistance region of that structure. FIG. 3 plots the PVCR as a function of RTA temperature for each of the three ITD structures.

For the "ITD with barrier" structure, a high annealing temperature of about 825° C. for one minute was found to produce the highest PVCR, specifically PVCR=3.6. The peak current density was about 0.3 kA/cm$^2$. In contrast, the "ITD ref1" and "ITD ref2" structures which omit the barrier silicon germanium layer 20 have lower optimal RTA temperatures. Specifically, "ITD ref1" has an optimal RTA temperature of 725° C. yielding PVCR=2.7, while "ITD ref2" has an optimal RTA temperature of 800° C. yielding PVCR=3.2. The higher annealing temperature for "ITD with barrier" was achieved due to suppression of diffusion of the boron acceptors of the p-type degenerate doping 22 by the barrier silicon-germanium layer 20.

Figure 4:
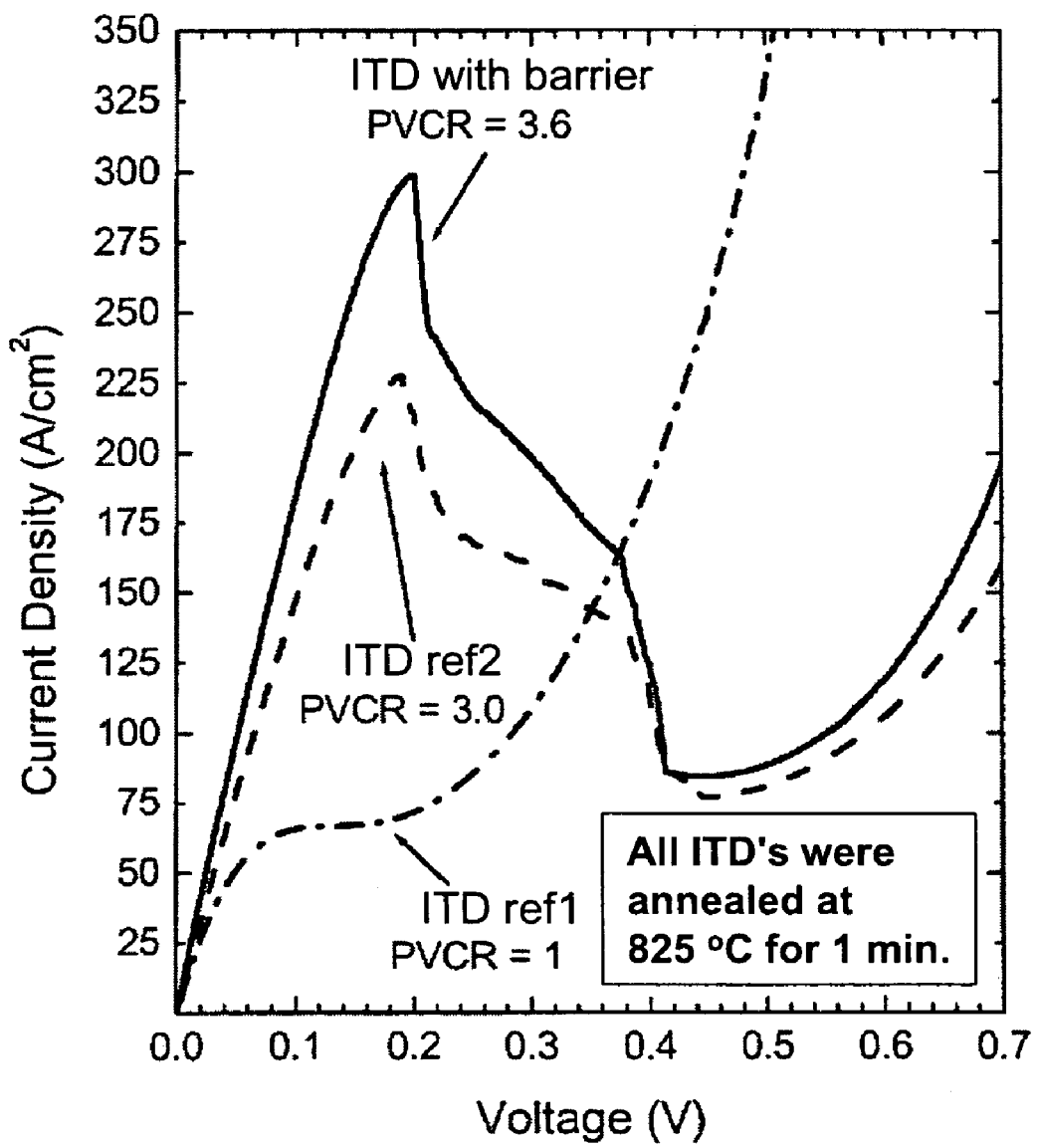
FIG. 4 shows current-voltage characteristics for the three different interband tunneling diode structures each annealed at 825° C. for one minute.

FIG. 4 shows the current-voltage characteristics for each of the "ITD with barrier", "ITD ref1", and "ITD ref2" structures, using the same RTA anneal of 825° C. for one minute. The "ITD with barrier" structure shows the highest PVCR=3.6. The "ITD ref1" structure shows PVCR=1, which corresponds to substantially no negative differential resistance region. The "ITD ref2" structure shows PVCR=3.0. It will be noted that all three structures have similar valley current values, and the difference in PVCR is due principally to differences in the peak current of the negative differential resistance region, suggesting that the improved PVCR for the "ITD with barrier" structure is due to suppressed boron diffusion during the RTA processing due to the barrier silicon-germanium layer 20.

While results for anneals of up to about 825° C. have been illustrated herein, improvement in negative differential resistance has been observed for anneals as low as 500° C., anneals of about 750° C. or higher have been found to substantially improve the negative differential resistance, and good thermal stability of interband tunneling structures with silicon-germanium outdiffusion barriers have been observed for anneals of around 900° C. These results indicate that a substantially extended thermal budget is provided by the barrier silicon-germanium layer 20. Moreover, those skilled in the art recognize that the thermal budget is a function both of anneal temperature and anneal time. While one minute RTA processing examples are illustrated herein, a higher anneal temperature can be traded off for a shorter anneal time or, conversely, a lower anneal temperature can be traded off for a longer annealing time. Since the acceptor diffusion coefficient across the barrier silicon-germanium layer 20 may have a non-linear dependence upon temperature, it is expected that such temperature/time tradeoffs may enable further optimization of the annealing schedule to increase annealing effectiveness for point defect removal while limiting outdiffusion of acceptors.

Figure 5:
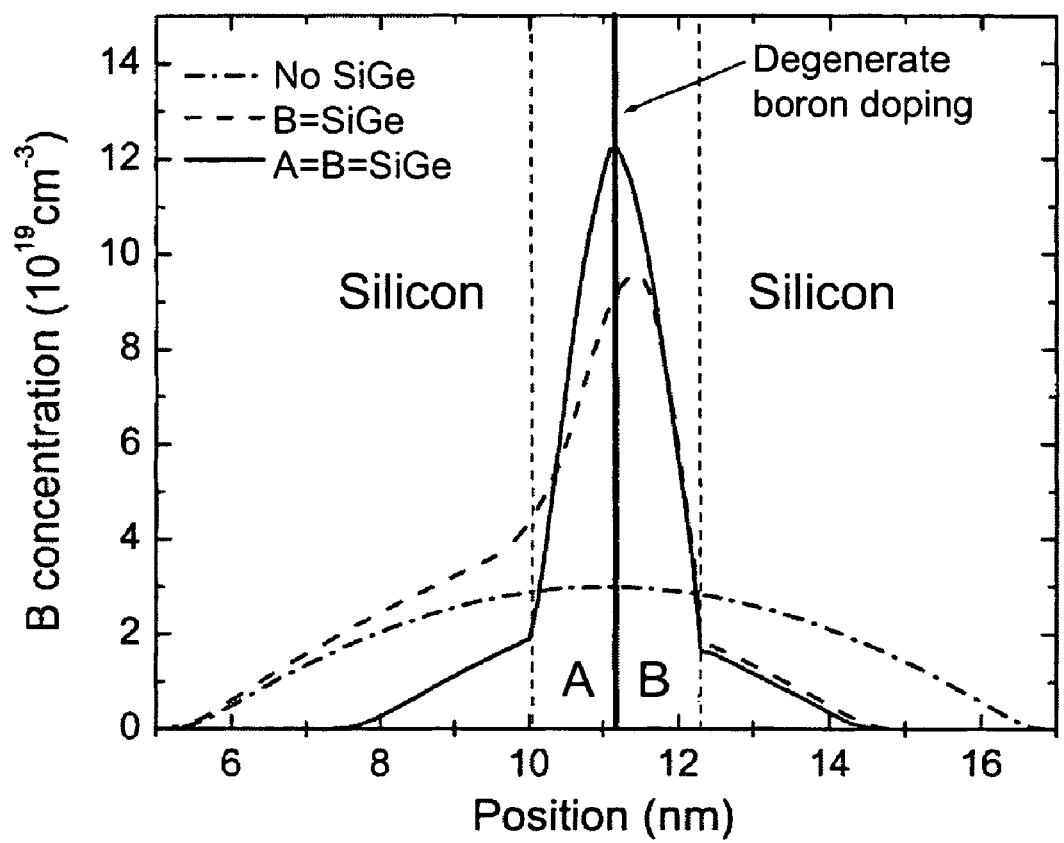
FIG. 5 shows simulated boron diffusion profiles for structures with no silicon-germanium, with an interposed silicon-germanium layer, and with both an interposed silicon-germanium layer and a barrier silicon-germanium layer.

With reference to FIG. 5, commercial simulation software (ATHENA Process Simulation Software, Santa Clara, Calif.) was employed to simulate the dopant displacement during post growth annealing. In the simulations whose results are depicted in FIG. 5, the boron degenerate doping before anneal was modeled as a one nanometer lateral width $10^{21}$ $cm^{-3}$ boron distribution with a lateral 0.2 nanometer waist. The outer regions below 10 nanometers and above about 16 nanometers were silicon in all simulations. FIG. 5 plots the simulated boron distribution after anneal for three simulations: (i) a simulation in which a both the left-hand interior region labeled "A" and the right-hand interior region labeled "B" were silicon-germanium, so that the boron degenerate doping was substantially contained within a single silicon-germanium layer; (ii) a simulation in which the left-hand interior silicon-germanium was replaced by silicon; and (iii) a simulation in which the structure contained no silicon-germanium. For simulation (i), the boron distribution after the simulated anneal remained substantially symmetric and substantially within the "A" and "B" regions. For simulation (ii) in which the left-hand silicon-germanium layer was omitted, the boron distribution has a substantial shoulder extending away from the peak on the left-hand side. For simulation (iii) which omitted silicon-germanium entirely, the boron distribution is greatly broadened compared with simulations (i) and (ii). These results demonstrate the effectiveness of the barrier silicon-germanium layer in suppressing boron outdiffusion away from the region of the p/n junction.

Figure 6:
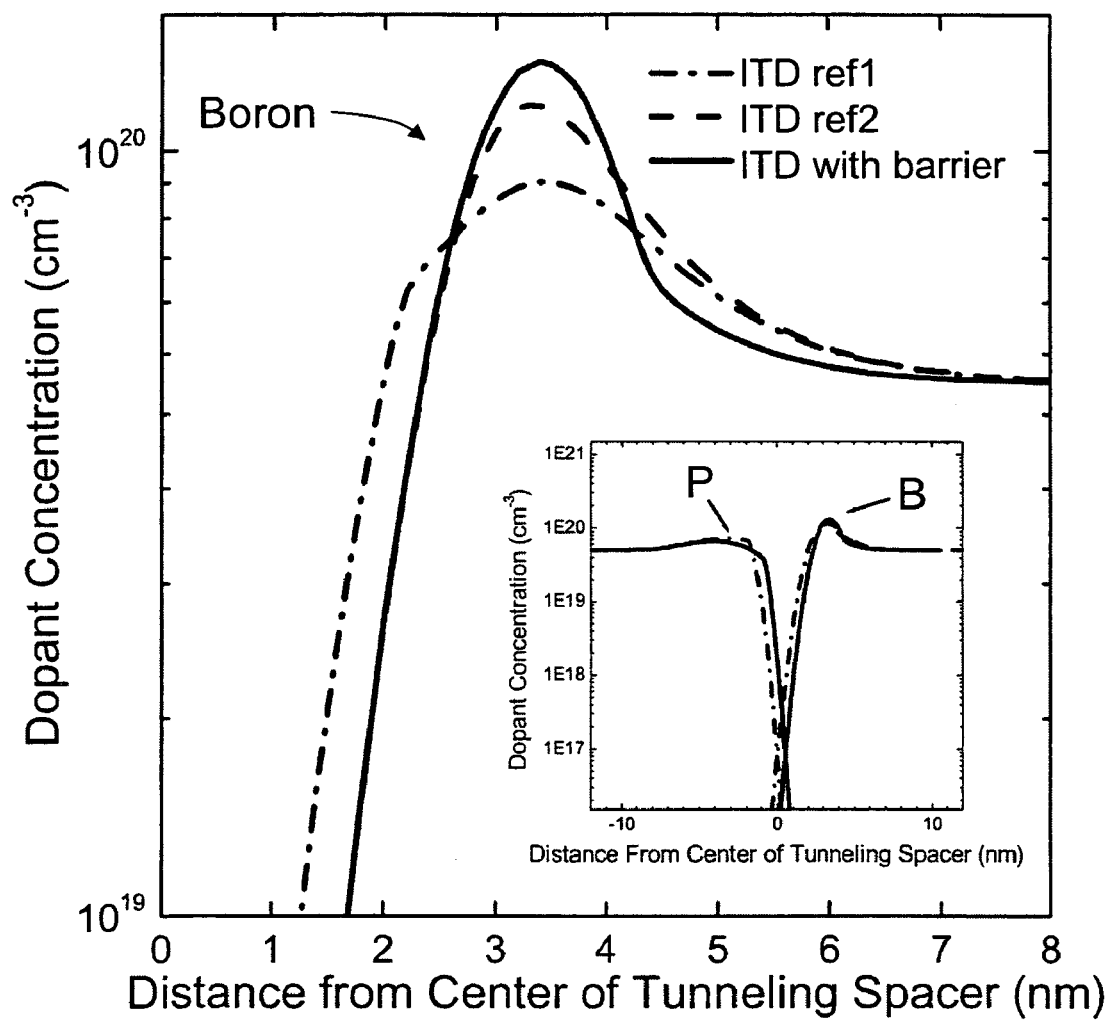
FIG. 6 shows simulated boron doping profiles for the three different interband tunneling diode structures for one minute 800° C. anneal simulations. Inset shows both the simulated boron ("B") and simulated phosphorus ("P") doping profiles after the simulated one minute 800° C. anneal.

With reference to FIG. 6, simulated boron dopant profiles are plotted for each of the "ITD with barrier", "ITD ref1", and "ITD ref2" structures, for a simulated RTA anneal of 800° C. for one minute. The inset plots both the boron and phosphorus dopant profiles for context. The "ITD with barrier" simulation shows the sharpest boron peak and the highest peak boron concentration after anneal. Again, these simulation results demonstrate effective suppression of boron diffusion by the barrier silicon-germanium layer 20.

The ITD structure of FIG. 1 can be incorporated into substantially any type of silicon-based device or silicon-based integrated circuitry using suitable modifications in the CMOS or other silicon fabrication process. To simplify incorporation of ITD structures with barrier silicon-germanium layers into standard silicon processing, integration is contemplated to include epitaxial growth of the ITD onto MOS or other silicon circuitry following the high temperature processes of the standard silicon processing but prior to metallization processing.

The "ITD with barrier" layer structure depicted in FIG. 1 is an illustrative example. Those skilled in the art can readily modify layer thicknesses, dopant levels, layer germanium fractions, dopant species, interposed layer sequences, and so forth to adapt the example ITD structures for specific applications. For example, it is contemplated to include a second barrier layer on the n-type side of the n-type degenerate doping to suppress diffusion of the donors away from the p/n junction.

Figure 7:
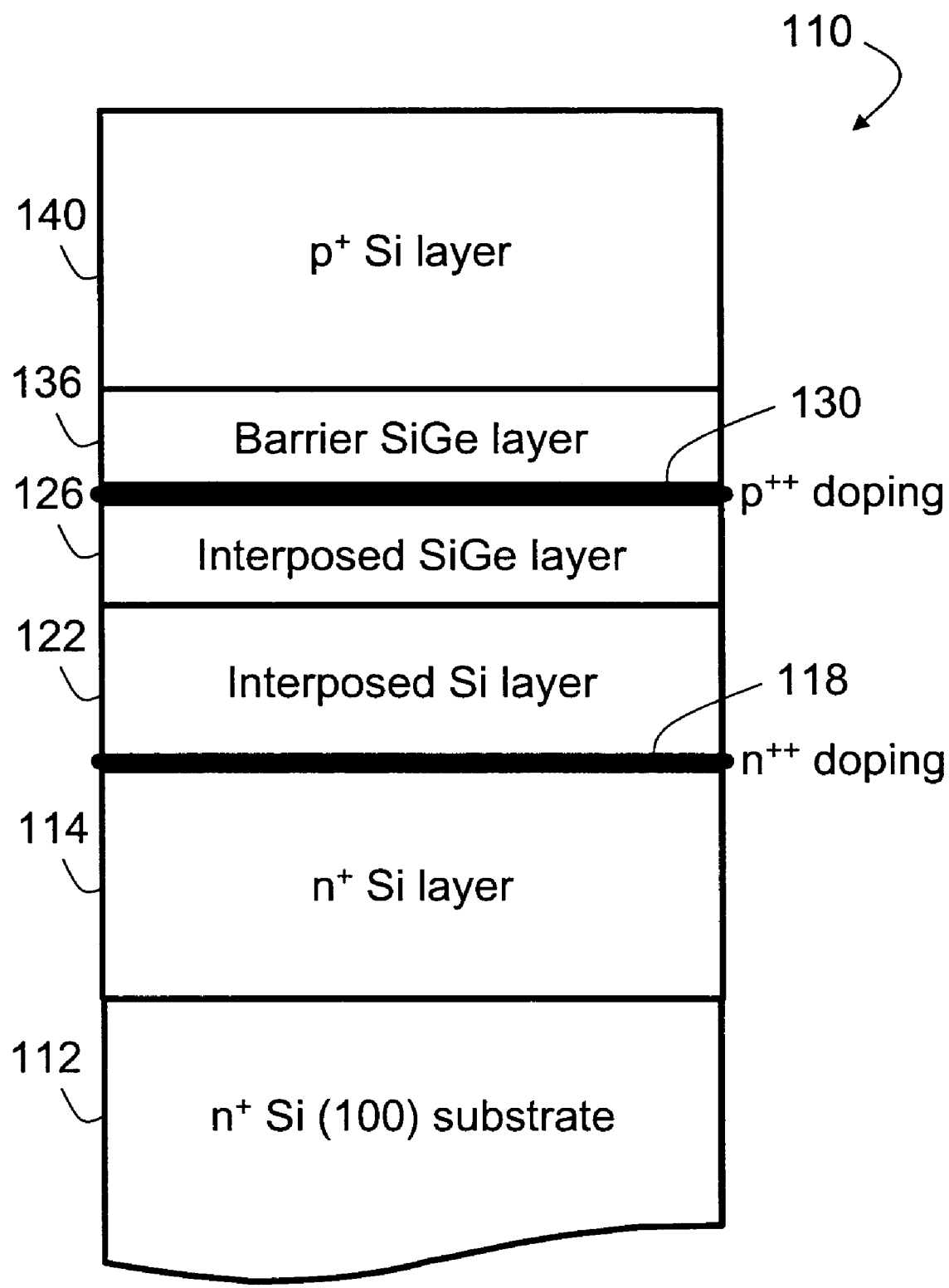
FIG. 7 diagrammatically shows the layer structure of an interband tunneling diode structure having a p-on-n orientation.

With reference to FIG. 7, an ITD 110 has an inverted polarity versus the ITD 10 of FIG. 1. The ITD 110 includes a plurality of group IV layers grown on an $n^+$ silicon substrate 112 by LT-MBE or another low temperature epitaxial growth method. The ITD 110 includes an epitaxial $n^+$ silicon layer 114 grown on the substrate 112 followed by a growth interruption during which an n-type degenerate doping 118 is formed atop the epitaxial $n^+$ silicon layer 114. An interposed silicon layer 122 is formed on the epitaxial $n^+$ silicon layer 114 and the n-type degenerate doping 118, followed by an interposed silicon-germanium layer 126. During a second growth interruption, a p-type degenerate doping 130 is formed atop the interposed silicon-germanium layer 126. A barrier silicon-germanium layer 136 is formed on the interposed silicon-germanium layer 126 and the p-type degenerate doping 130, followed by an epitaxial $p^+$ silicon layer 140. In some contemplated embodiments of the ITD structure 110, the silicon layers 114, 140 are doped to a level of about $5 \times 10^{19}$ $cm^3$, the degenerate dopings 118, 130 are doped at a planar doping level of about $1 \times 10^{14}$ $cm^{-2}$, and the silicon-germanium layers 126, 136 have germanium fractions of about 0.4. The ITD 110 would be suitable, for example, to be placed onto n-type implanted source and drain regions of NMOS circuitry.

In order to obtain a sharp profile for the n-type degenerate doping 118, the growth temperature was lowered to about 320° C. during the n-type degenerate doping growth interruption. After the n-type degenerate doping, growth was resumed at about 320° C. for about the first 2-5 nanometers of the interposed silicon layer 122, followed by another growth interruption during which the growth temperature was elevated, followed by formation of the remainder of the ITD 110. Depositing a capping silicon layer of about 2-5 nanometers at about 320° C. is believed to suppress surface segregation of the n-type dopant and hence provide a sharper n-type degenerate doping profile.

In either ITD 10, 110, the barrier silicon-germanium layer 20, 136 should have a germanium fraction of at least about 0.1. A lower germanium fraction reduces the effectiveness of the layer in blocking diffusion of acceptors.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. A silicon-based interband tunneling diode comprising:
   a degenerate p-type doping of acceptors;
   a degenerate n-type doping of donors disposed on a first side of the degenerate p-type doping; and
   a barrier silicon-germanium layer disposed on a second side of the degenerate p-type doping opposite the first side, the barrier silicon-germanium layer suppressing diffusion of acceptors away from a p/n junction defined by the degenerate p-type and n-type dopings.

2. The silicon-based interband tunneling diode as set forth in claim 1, wherein the acceptors of the degenerate p-type doping are selected from a group consisting of boron, aluminum and gallium.

3. The silicon-based interband tunneling diode as set forth in claim 2, wherein the donors of the degenerate n-type doping are selected from a group consisting of lithium, antimony, phosphorus, arsenic and bismuth.

4. The silicon-based interband tunneling diode as set forth in claim 1, further comprising:
one or more interposed group IV semiconductor layers interposed between the degenerate p-type doping and the degenerate n-type doping.

5. The silicon-based interband tunneling diode as set forth in claim 4, wherein the one or more interposed group IV semiconductor layers include at least one of a silicon layer and a silicon-germanium layer.

6. The silicon-based interband tunneling diode as set forth in claim 4, wherein the one or more interposed group IV semiconductor layers comprise:
an interposed silicon-germanium layer adjacent the barrier silicon-germanium layer and the degenerate p-type doping, the interposed silicon-germanium layer and the barrier silicon-germanium layer defining a unitary silicon-germanium layer substantially containing the degenerate p-type doping.

7. The silicon-based interband tunneling diode as set forth in claim 6, wherein the interposed silicon-germanium layer and the barrier silicon-germanium layer have the same germanium fraction.

8. The silicon-based interband tunneling diode as set forth in claim 1, wherein the barrier silicon-germanium layer has a germanium fraction of at least about 0.1.

9. The silicon-based interband tunneling diode as set forth in claim 1, wherein the barrier silicon-germanium layer has a germanium fraction of at least about 0.4.

10. The silicon-based interband tunneling diode as set forth in claim 1, wherein the barrier silicon-germanium layer has a thickness of about one nanometer or thicker.

11. The silicon-based interband tunneling diode as set forth in claim 1, wherein the barrier silicon-germanium layer has a uniform germanium concentration.

12. The interband tunneling diode as set forth in claim 1, wherein the acceptors of the degenerate p-type doping have a concentration distribution along a direction transverse to the barrier silicon-germanium layer corresponding to a post-growth anneal of greater than about 800° C.

13. The silicon-based interband tunneling diode as set forth in claim 1, wherein the degenerate n-type doping is a delta doping forming a degenerate two-dimensional electron gas.

14. The silicon-based interband tunneling diode as set forth in claim 13, wherein the degenerate p-type doping is a delta doping forming a degenerate two-dimensional hole gas.

15. An interband tunneling diode comprising:
one or more semiconductor layers selected from a group consisting of (i) a silicon layer and (ii) a silicon-germanium layer;
a degenerate p-type doping of acceptors substantially disposed within a containing silicon-germanium layer of the one or more semiconductor layers, the containing silicon-germanium layer suppressing diffusion of the acceptors out of the containing silicon-germanium layer; and
a degenerate n-type doping of donors substantially disposed within or between one or more of the semiconductor layers other than the containing silicon-germanium layer.

16. The interband tunneling diode as set forth in claim 15, wherein the degenerate n-type doping of donors is substantially disposed within a silicon layer of the one or more semiconductor layers.

17. The interband tunneling diode as set forth in claim 15, wherein the acceptors of the degenerate p-type doping have a concentration distribution along a direction transverse to the plane of the containing silicon-germanium layer corresponding to a post-growth anneal of greater than about 800° C.

18. A semiconductor device made by a process comprising:
forming an interband tunneling structure by successively forming one of:
a barrier silicon-germanium layer, a degenerate p-type doping, and a degenerate n-type doping, in that order, and
a degenerate n-type doping, a degenerate p-type doping, and a barrier silicon-germanium layer, in that order.

19. The semiconductor device as set forth in claim 18, wherein the forming is by one of low temperature molecular beam epitaxy, solid phase epitaxy, low pressure chemical vapor deposition or ultra-high vacuum chemical vapor deposition.

20. The semiconductor device as set forth in claim 18, wherein the process further comprises:
after the forming, annealing the formed interband tunneling structure at a temperature greater than 500° C., the barrier silicon-germanium layer suppressing outdiffusion of acceptors of the degenerate p-type doping away from a p/n junction during the annealing.

21. The semiconductor device as set forth in claim 18, wherein the process further comprises:
after the forming, annealing the formed interband tunneling structure at a thermal budget corresponding to an anneal temperature greater than or about 750° C. and an anneal time of about one minute.

* * * * *